(12) United States Patent
Berman et al.

(10) Patent No.: US 6,982,206 B1
(45) Date of Patent: Jan. 3, 2006

(54) MECHANISM FOR IMPROVING THE STRUCTURAL INTEGRITY OF LOW-K FILMS

(75) Inventors: Michael J. Berman, Portland, OR (US); Steven E. Reder, Boring, OR (US); Hemanshu Bhatt, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 86 days.

(21) Appl. No.: 10/679,004

(22) Filed: Oct. 2, 2003

(51) Int. Cl.
*H01L 21/76* (2006.01)
(52) U.S. Cl. .................. 438/400; 427/462; 427/509
(58) Field of Classification Search ........... 438/400; 427/462, 474, 509
See application file for complete search history.

(56) References Cited

U.S. PATENT DOCUMENTS

| | | | |
|---|---|---|---|
| 6,030,904 A * | 2/2000 | Grill et al. ................. 438/781 |
| 6,168,726 B1 * | 1/2001 | Li et al. ...................... 216/79 |
| 6,420,092 B1 * | 7/2002 | Yang et al. ................. 430/311 |
| 6,433,301 B1 * | 8/2002 | Dunsky et al. ........ 219/121.67 |
| 6,531,777 B1 * | 3/2003 | Woo et al. .................. 257/752 |
| 6,753,483 B2 * | 6/2004 | Andoh et al. .............. 174/262 |
| 6,781,090 B2 * | 8/2004 | Sun et al. ............. 219/121.71 |
| 2001/0026956 A1 * | 10/2001 | Baklanov et al. ........... 438/118 |
| 2003/0047541 A1 * | 3/2003 | Sun et al. ................. 219/121.7 |
| 2004/0022012 A1 * | 2/2004 | Yamamoto et al. ......... 361/600 |
| 2004/0051169 A1 * | 3/2004 | Chen et al. ................. 257/684 |
| 2004/0089471 A1 * | 5/2004 | Andoh et al. ............... 174/262 |

* cited by examiner

*Primary Examiner*—George Fourson
*Assistant Examiner*—Fernando L. Toledo
(74) *Attorney, Agent, or Firm*—Beyer Weaver & Thomas, LLP

(57) ABSTRACT

According to one embodiment, a method of forming a low-k dielectric composite film is provided. A low-k interconnect dielectric layer is strengthened by forming whiskers in the low-k film. The whiskers are formed simultaneously with the low-k layer. In one embodiment, the low-k structure is removed by heating a volatile matrix film, leaving a whisker residue.

19 Claims, 4 Drawing Sheets

MECHANISM FOR IMPROVING THE STRUCTURAL INTEGRITY OF LOW-K FILMS

BACKGROUND OF THE INVENTION

1. Field of the Invention

The present invention relates to methods for forming low-k dielectric films on semiconductor wafers. More particularly, the present invention relates to methods for forming low-k dielectric layers with improved structural integrity during the manufacture of semiconductor integrated circuits.

2. Description of the Related Art

As integrated circuits become smaller, it becomes more desirable to reduce interconnection delays through the selection of materials used in the interconnects and associated dielectric layers. The propagation delays through the interconnects are proportional to the resistance of the interconnects and the capacitance offered by the dielectric. In fact, as integrated devices become smaller, the resistance capacitance (RC) delay time of signal propagation along interconnects becomes the dominant factor limiting overall chip speed. In order to improve the interconnect performance, higher conductance and lower capacitance is required of the interconnects. In order to accommodate these objectives, the trend has been towards the use of copper for interconnects and damascene methods for forming the interconnects in low-k layers.

For conductors, copper has gained favor in the industry because of its many advantages, including its low resistance. In such processes, conducting metal (e.g., copper) is inlaid into trench and via structures of insulating material (e.g., low-k dielectric materials). CMP (Chemical Mechanical Polishing) is used to remove conducting metal (e.g., copper) in single or dual damascene processes. With the advent of copper technology, resistance has been minimized and attention has been focused on reducing capacitance.

One method conventionally used to reduce capacitance is to reduce the average dielectric constant k of the thin insulating films surrounding interconnects through the introduction of porosity. The dielectric layers in conventional integrated circuits have traditionally been formed of $SiO_2$, which has a dielectric constant of about 4.1. A number of dielectric materials have been developed having a dielectric constant lower than that of $SiO_2$. These are generally referred to as low-k materials and several of these layers may appear on a wafer. That is, integrated circuits are often made up of many interconnect levels to connect the various devices of the circuit. The low-k dielectric materials are used to electrically isolate the different levels of metallization as well as isolate the metal interconnects on the same level. Thus, a semiconductor device may include several low-k layers disposed on top of each other.

Introduction of porosity to reduce the dielectric constant can result in a reduction of strength and structural stability. That is, the lack of mechanical rigidity of the composite low-k and metal interconnect materials causes delamination of the low-k to low-k layers and low-k to copper layers a well as cracking of the bulk material. The mechanical strength of low-k films is considerably less than that of traditional silicon dioxide. That is, as the dielectric constants reach lower values, the structural integrity of the films decrease. While not wishing to be bound by any particular theory, it is believed that to decrease the k value of the film, porosity must be introduced.

For example, the k value of $SiO_2$ is approximately 4.1 whereas the k value of air is defined as 1. By adding different materials to the base $SiO_2$ layer, lower k values can be obtained. Unfortunately a point is quickly reached where the only way to effectively lower the k value is to introduce porosity (effectively air) into the film itself. This feature causes the significant structural integrity problem observed in the film.

This compromised mechanical strength of the low-k film significantly increases the likelihood of damage to the structure of the low-k copper dual damascene system during conventional chemical mechanical polishing (CMP). The films tend to crack, shear and otherwise cause defects that render semiconductor devices useless. That is, while the wafers are subjected to chemical mechanical polishing (CMP), shear stresses and other mechanical damage may cause defects that cause the devices to fail. This problem is compounded with integration of higher levels of metallization.

This presents an ever-challenging task for CMP and developers of dielectric films. For example, CMP vendors are working on new pad materials and slurry solutions to optimize planarization with a much lower down force, but this approach has its limitations. Alternate methods of planarization are in their infancy. One current solution is to compromise the k-value for the added mechanical strength. However, for smaller technology nodes, the k values for the inter metal dielectric (IMD) need to be lowered to reduce the RC delay.

The low-k dielectric materials used to electrically isolate the different levels of metallization in a silicon substrate present other mechanical problems as well. The electrical connections between different interconnection levels are made through the use of metallized vias. Thus, a semiconductor device may include several low-k layers attached on top of each other, each low-k layer to low-k layer interface offering a potential delamination problem.

Moreover, low-k materials offer poor resistance to compression. This is significant in packaging of dies. For example, once the integrated circuits on the wafer are completed, i.e., layering and patterning are implemented, the wafer is conventionally sliced into sections known as die. The die are conventionally packaged to facilitate electrical connections to external circuitry. Generally, in semiconductor manufacturing, an individual semiconductor die is mounted to a substrate and then sealed by an encapsulant or by a molding operation. After mounting, electrical connection from the die to the package bonding pads may be completed using wire bonding techniques, for example. Typically, after packaging, the packaged die is placed flat on the printed circuit board ("PCB") and electrical connections made to traces or landings on the printed circuit board, for example by wire bonding, solder ball bonding, or other conventional methods.

Any of these connection methods may place large stress forces on the substrate. For example, wire bonding requires that a large compressive force be placed on the bonding pad as heat is generated to "weld" the bonding wire to the pad. In using solder balls for connections to external circuitry, the ball bonding process window is directly related to the mechanical strength of the composite films that make up the bed and affects the ability to route circuitry under the ball bond pad. Often, however, the low-k layers underneath the bonding pad may comprise as may as 10 or more layers. The poor mechanical strength of the low-k material under the bonding pad thus may affect the ability to route circuitry under the ball bond pad. That is, interconnect circuitry placed under the bond pad may be damaged from the forces imposed during wire bonding, such as by crushing the underlying dielectric layers, or similarly damaged from other electrical connection methods. The poor mechanical properties of the low k film affect the overall reliability of the chip and the types of packages that can be used for the chip.

Accordingly, it is desirable to provide improved methods for increasing the structural integrity of the low-k films without appreciably affecting the low k values of the dielectric film

SUMMARY OF THE INVENTION

To achieve the foregoing, the present invention provides methods for forming a new material composition for a dielectric layer. The present invention uses in various embodiments nanostructure whiskers as a mechanical strengthening material in the low k film. By integrating nanostructure whiskers, a new ultra low k material to be used for inter-metal dielectrics is provided, i.e., a whisker-containing composite structure. The new ultra low k material preferably is a spin on liquid or a deposited solid.

When incorporated into the dielectric in accordance with the guidance provided by this description, the new low-k material will offer an order to several orders of magnitude increase in the structural integrity of the material.

In one embodiment, the present invention provides a semiconductor device structure having a low-k dielectric film with improved mechanical strength. According to one embodiment, the method of forming a semiconductor integrated circuit dielectric composite film includes forming a dielectric matrix film on a semiconductor wafer and distributing whiskers throughout the dielectric matrix film to form the dielectric composite film. In one embodiment, the dielectric matrix film is a low-k dielectric layer.

These and other features and advantages of the present invention are described below with reference to the drawings.

DETAILED DESCRIPTION OF PREFERRED EMBODIMENTS

Figure 1A:
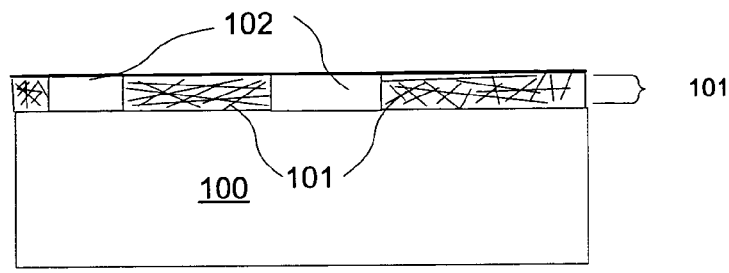
FIGS. 1A–E are diagrams illustrating the stages in the process of forming a low-k composite film in accordance with one embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

As discussed above, with increasing miniaturization of integrated circuits, the trend has been towards incorporating copper interconnect metal layers with low-k dielectric layers in forming the interconnect levels for these circuits. These interconnect layers are typically formed by damascene methods. The copper interconnect lines are formed by polishing away the field copper, the seed layer, and the diffusion barrier down to the underlying dielectric. The softer and more porous low-k dielectrics are generally unable to withstand the extreme stresses created by chemical mechanical polishing. As the low-k layer tends to be more porous in order to achieve a lower overall dielectric value, these and other mechanical properties of the dielectric suffer.

The present invention overcomes these problems by providing a composite dielectric structure using whisker reinforcing fibers. That is, the dielectric composite film is formed from a dielectric matrix, such as $SiO_2$ based or conventional low-k films, with a filler reinforcing material comprising whiskers. Whiskers are extremely fine filamentous single crystals with enhanced structural properties such as high Young's modulus and fracture toughness. They are discontinuous rod or needle shaped fibers. Whiskers have been traditionally used in the ceramic industry to improve mechanical strength and fracture toughness of ceramics, metals and polymers. The whiskers as used in embodiments of the present invention are preferably single crystal nanostructures that have very high aspect ratios, are randomly oriented, and distributed throughout the matrix low-k material. Nanostructure materials are typically defined as materials having one dimension such as length between 1 and 100 nm.

Whiskers exhibit mechanical properties that closely approach the theoretical values for the material comprising the whisker. In a preferred embodiment, the whiskers occupy relatively low volume (1 to 5%) to the volume of the matrix thereby minimizing the increase in the overall k value of the composite material. The whiskers may be formed from any material that can be manufactured as a whisker nanostructure. Preferably, the whiskers are formed from insulating ceramics such as SiC and $Si_3N_4$, oxides, or polymers. According to one embodiment, the whiskers are formed from carbon processed to form diamond structured whiskers.

Preferably, the whiskers are formed or selected to have high aspect ratios and variable lengths, preferably on the order of the metal pitch to ensure a formation of a strong 3D substructure in which the low-k matrix can be incorporated. However, the lengths may be any length and still be functional in single or dual damascene applications. Therefore the scope of the invention is intended to extend to include whiskers of any length that may be incorporated into the dielectric film. By including the whiskers in the dielectric composite film, a structural matrix with improved mechanical strength over conventional low-k layers is obtained, one that can withstand a variety of stresses, including those from planarization and other forms of processing. For illustration purposes, whiskers have been shown and described as a reinforcing material in the dielectric matrix. However, the scope of the invention is not limited to whiskers but rather to extend to include any reinforcing fiber. For example, fibers can be made of any poly crystalline material and do not have size limitation in their axial direction.

Thus, the invention is intended to include single crystal whiskers as well as fibers, such as generally non-conductive materials having high aspect ratios. For example, suitable fibers include SiC, $Si_3N_4$, $Al_2O_3$, carbon, etc.

FIGS. 1A–E are diagrams illustrating the stages in the process of forming a low-k composite film in accordance with one embodiment of the present invention. The process commences, as illustrated in FIG. 1A, with the formation of the metal 1 layer, i.e., interconnects 102 formed on the partially processed wafer 100. In this context, the partially processed wafer 100 refers to a wafer processed according to conventional steps up to the metal 1 layer. That is, the partially processed wafer includes the conventional formation of gates, gate oxides, implanted wells, and diffusion areas on preferably a silicon substrate, all according to conventional methods. Methods of forming local interconnects and gates on substrates are well known to those of skill in the relevant art and therefore further description here is deemed unnecessary. For clarity of illustration, the gates, oxides, and diffusion areas of the partially processed wafer 100 are not shown in FIGS. 1A–1E. The interconnects 102 are illustrated as formed in a composite dielectric film 101 by a single damascene method, the composite film 101 comprising a dielectric matrix and whiskers, the composition and method of forming the composite film in accordance with the techniques described further below with respect to the formation of low-k layer composite film 104. Following the deposition of the interconnect metal 102 in the etched trenches in the composite film 103, a planarized surface is produced by conventional methods to serve as a base for additional interconnect layers.

Figure 1B:
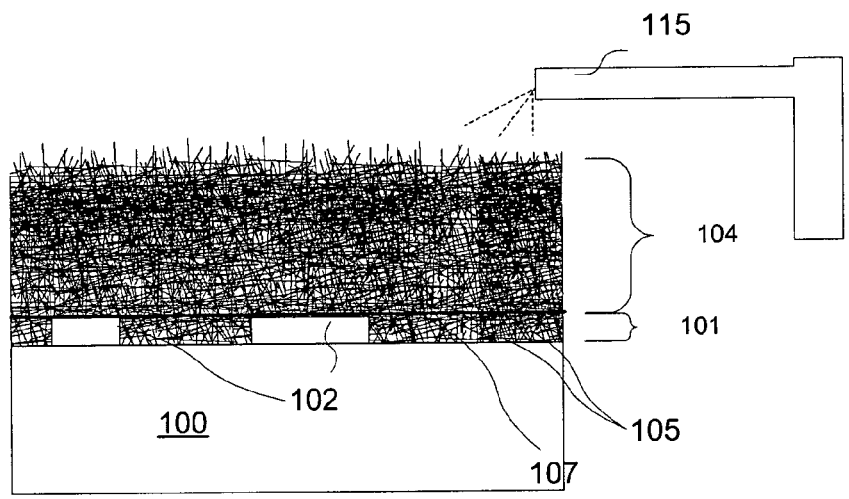

Next, as illustrated in FIG. 1B, the whisker reinforced low-k layer composite 104 is formed on top of the metal 1 layer (i.e., interconnects 102).

Preferably, as illustrated, the low-k matrix material is formed by spin-on methods. That is, the low-k matrix material is premixed with the reinforcing whiskers, i.e., the whiskers are suspended in a solution, the solution formed on the partially processed wafer 100 by spin on methods, i.e., by dispersing the low-k whisker suspension liquid through a dispensing arm 115 onto a rotating wafer. Spin on methods are known to those of skill in the art and therefore further description is deemed unnecessary here.

Figure 3:
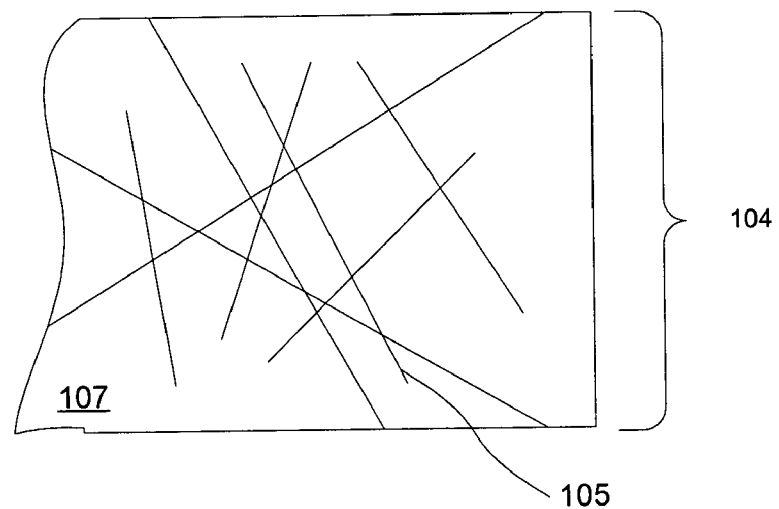
FIG. 3 illustrates an enlarged view of a portion of the low-k composite 104 illustrated in FIG. 1B

FIG. 3 illustrates an enlarged view of a portion of the low-k composite 104 illustrated in FIG. 1B, showing in greater detail the rod shaped whiskers 105 dispersed in the dielectric matrix 107.

The reinforcing whiskers 105 may be provided in the form of a nanostructure powder and mixed with the low-k matrix liquid form. That is, a whisker powder may be used as a starting material. Nanostructure powders, such as including ceramic powders, are available commercially and known to those of skill in the art. Hence, further details are deemed unnecessary here. Although formation of the whisker-reinforced layer by this method is preferred, the invention is not so limited. The whisker-reinforced layer may be formed by any deposition method that permits the distribution of the whiskers throughout the base low-k layer.

For example, in an alternative embodiment illustrated in FIG. 1B', the low-k matrix material is deposited by a chemical vapor deposition (CVD) method, for example, by releasing precursor gases 103 through showerhead 110 while the reinforcing whiskers 105' are injected from the periphery of the showerhead 110. The reinforcing whiskers 105' may be provided in the form of a nanostructure powder and blown in to combine with the precursor gases 103 as they deposit a solid matrix film 104 on the partially processed wafer.

The low-k whiskers, in one preferred embodiment, comprise single crystal nano-structures with high aspect ratios, random orientation, and are preferably distributed uniformly throughout the low-k material. Preferably, the whiskers comprise an insulating ceramic material, for example, SiC or $Si_3N_4$. These examples are illustrative and not intended to be limiting. Any material that can be manufactured as a whisker nano-structure is suitable, for example also including oxides and polymers. Preferably, the whiskers are formed from high rigidity materials with high insulating thermal conductivities and low thermal expansion coefficient values. As discussed above, the reinforcing material may alternatively comprise any suitable fibers.

The whiskers-reinforcing fibers may be used to form composite dielectric layers as described herein by suitably combining the whiskers with any existing low-k dielectric material as the matrix, for example by the process steps described above. For example, the low-k dielectric matrix may comprise organically modified silicon dioxide films (i.e., carbon doped oxides) such as used in CVD deposition processes. As another example, spin on low-k materials including porous films may be used. For example, various SILK low-k layers, such as nonporous SILK and porous SILK D, manufactured by Dow Chemical of Midland, Mich., are commercially available low-k layers that are suitable for use in the reinforced composite dielectric layers of the present invention. These examples are illustrative and not intended to be limiting. That is, any of the existing low-k layers may be used to form the matrix for containing the distribution of reinforcement whiskers. Preferably the dielectric matrix layer has a thermal coefficient of expansion compatible with the whiskers. The thickness of the dielectric matrix, and hence the thickness of the resulting low-k dielectric composite may be selected, without limitation, as appropriate to the chip technology processing nodes. For example, for a 90 nm processing node, the resulting low-k dielectric composite film would be expected to have a thickness in the range of 300 to 600 nm.

Without wishing to be bound by any theory, it is believed that the structural advantages provided by the whiskers stems in part from the inherently defect free properties of the whiskers. Generally, nanocrystalline whiskers have very high hardness values owing in part to the single crystal structures of the whiskers. As noted earlier, whiskers have been used for reinforcement in several industries, particularly in cutting tool applications. For example, SiC whiskers have been previously added to alumina to increase the metal removal capabilities of cutting tools. Reinforcement whiskers thus may be formed using commercially available nanostructure powders or by other methods known to those of skill in the relevant art.

Thus, the composite low-k layer preferably comprises a ceramic matrix material and nanostructure whiskers, the whiskers preferably having varying lengths. In accordance with one embodiment, the whiskers are preferably in the range of 1 to 50 nm in length, more preferably in the range of 5 to 20 nm. Preferable diameters for the whiskers are expected to be in the range of 0.1 to 5 nm, however the scope of the invention is not so limited. These ranges are expected to be suitable for current generation device technology features and corresponding metal pitches. The lengths and diameters described are intended to be illustrative and not limiting. It is understood that the size of the whiskers will scale with the miniaturization of integrated circuits and the decrease in pitch of the metal interconnect lines. Preferably, the whiskers are formed with aspect ratios in the range of 5:1 to 300:1, more preferably greater than 50:1. However, the scope of the invention is intended to extend to all shapes and sizes of whiskers incorporated in the low-k dielectric composite film.

In order to provide a low-k composite layer with suitable electrical and mechanical properties, preferably a nonconductive whisker is distributed throughout a nonconductive matrix layer. In order to avoid compromising the overall k values for the dielectric layer, the whiskers preferably occupy a relatively low volume in relation to the volume of the matrix, preferably from 0.1 to 10%, more preferably 0.1 to 5%. Thus, the composite low-k layer of the present invention with whiskers may be formed, the whiskers preferably comprising a relatively low density.

Figure 1C:
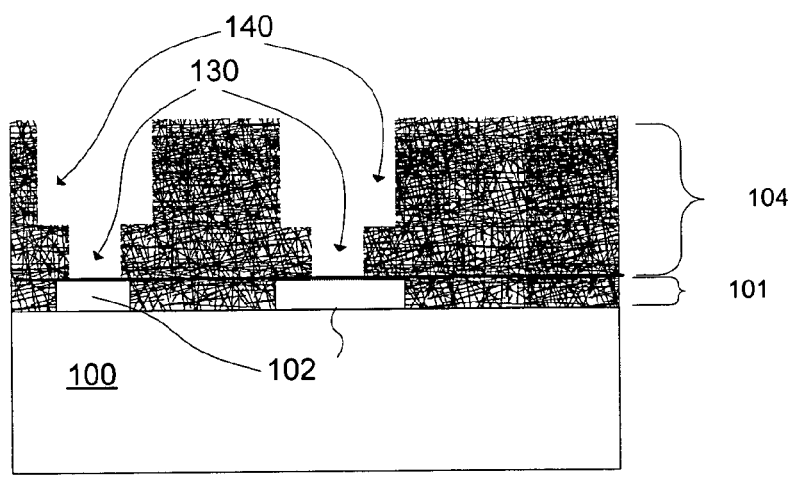
Figure 1B:
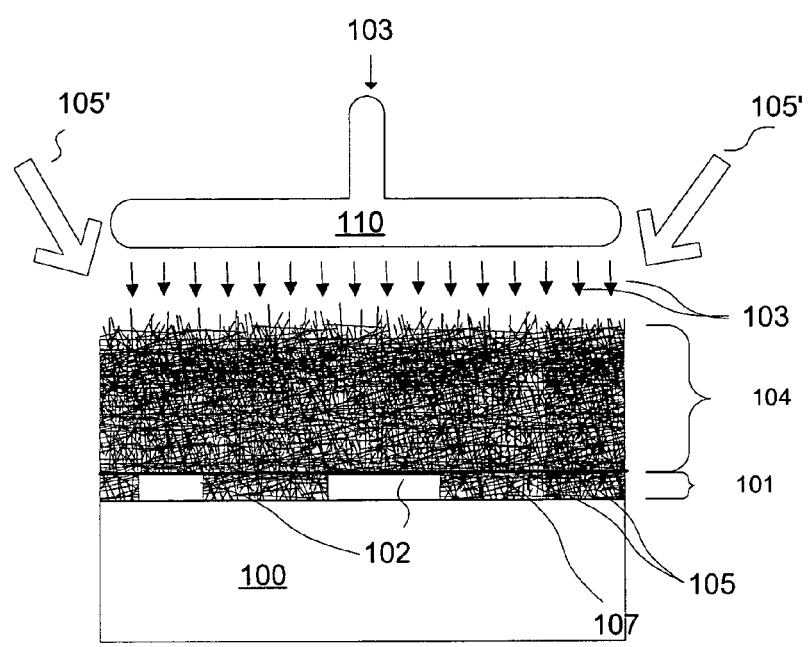

Next, as illustrated in FIG. 1C, patterning and etching of the low-k layer is performed according to methods known to those of skill in the relevant art. For example, according to dual damascene methods, vias 130 and trenches 140 may be formed in the low-k layer by patterning and etching the low-k dielectric composite film 104. The previous details are intended to be illustrative and not limiting. For example, the composite dielectric layers as described in embodiments of the present invention may be formed for use in single damascene formed interconnects as well as "subtractive" interconnect formation processes, for example, where conductors such as aluminum are formed inlayers then patterned and etched to form interconnects. Details as to conventional techniques for forming single and dual damascene interconnect structures are well known to those of skill in the relevant art and thus further and complete details as to the formation of the inlaid or other metal interconnects in the described low-k dielectric composite layers are deemed unnecessary here.

Figure 1D:
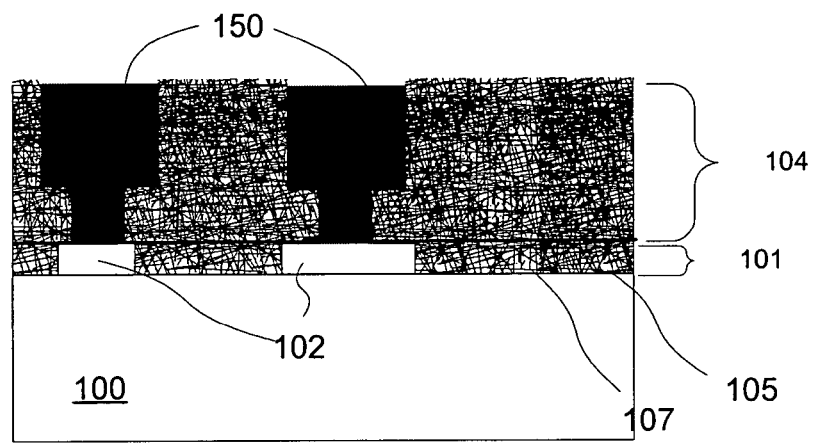
Figure 1E:
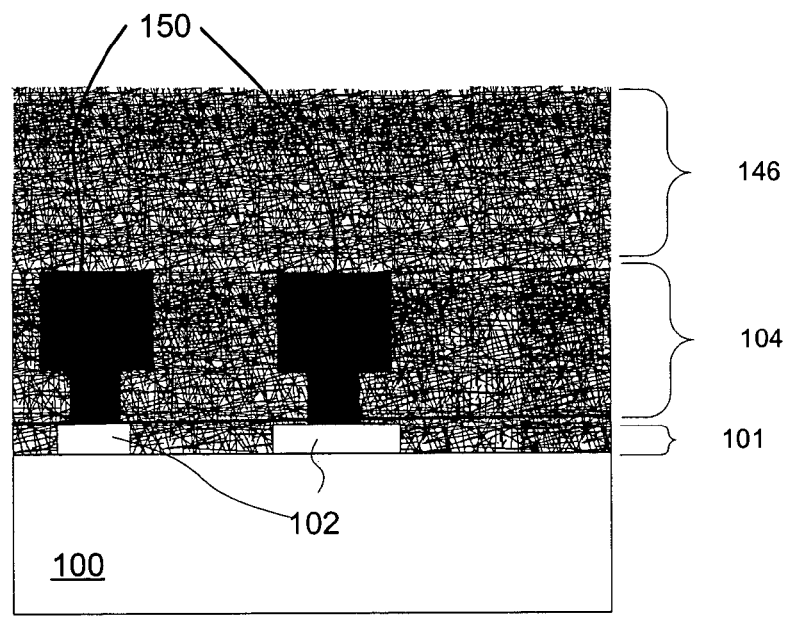

Next, as illustrated in FIG. 1D, after filling the trenches 140 and vias 130 with copper, chemical mechanical polishing takes place. FIG. 1D illustrates the interconnects 150 after polishing. Although shown formed as an intermetal dielectric layer (IMD), the low-k composite layer of the present invention may be used to insulate any one or more of several interconnect metal layers or as a pre-metal dielectric (PMD) layer. As shown in FIG. 1E, another low-k composite layer 146 is deposited on the planarized surface of the copper filled interconnects 150 and the first low-k dielectric composite film 104 (i.e., an IMD layer), and the process repeated for additional interconnect levels. Thus, the low-k layers formed by the techniques of the present invention may be formed in any interconnect dielectric level, or as a dielectric layer for any level of metallization. That is, the low-k composite layers of the present invention may be used without limitation as any interlayer dielectrics (ILD's), for example in pre-metal dielectrics (PMD's) such as between local interconnects and gates as well as intermetallic dielectric (IMD) layers. Moreover, the low-k composite layers of the present invention may be used without limitation in single and dual damascene processes as well as subtractive interconnect formation processes. The scope of the invention is intended to be extended accordingly. Thus, as shown in FIG. 1E, further interconnect layers may be formed using the low-k composite layers of the present invention to insulate the additional interconnect levels.

Figure 2B:
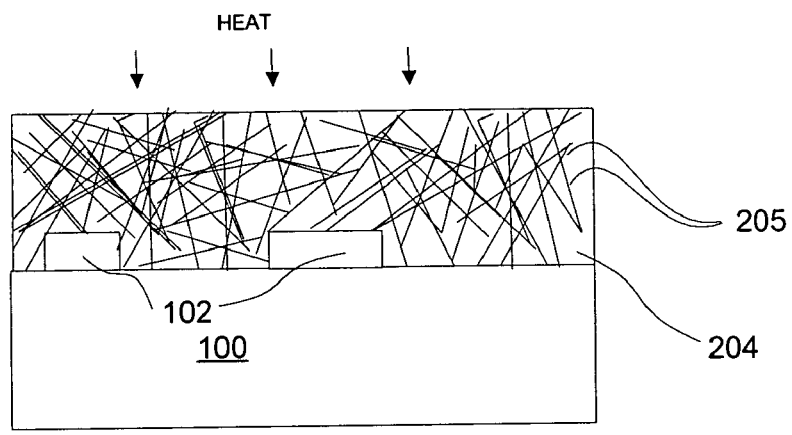
FIGS. 2B, and 2B' are diagrams illustrating the stages in the process of forming a low-k composite film in accordance with an alternative embodiment of the present invention.
Figure 2B:
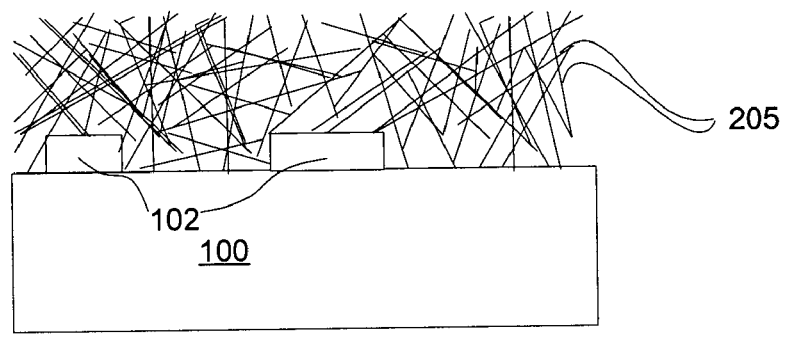

According to an alternative embodiment, the overall low-k value may be further reduced by dispersing the reinforcement whiskers in a volatile dielectric matrix layer followed by removal of the volatile layer. For example, as illustrated in FIG. 2B, the whiskers 205 are formed in a volatile matrix layer 204 formed on a partially processed wafer 100 and interconnects 102. Next, as illustrated in FIG. 2B', the volatile components are shown removed, preferably by heating. It is preferred that the volatile dielectric matrix layer will vaporize at relatively low temperatures, preferably in the range from 250 to 400 C. Typical back-end processing steps expose wafers to temperatures in the range of about 250 to 450 C, thus, the volatile low-k films would release the volatile components at temperatures provided during the normal processing steps. Thus, a volatile dielectric matrix compound 205 may be heated to a temperature in the range of 250 to 400 C, to "flash-off" the volatile organics in the matrix. That is, the organic phase is heated or burned off, leaving the whiskers in a structural matrix with an overall dielectric constant (k) value much lower than present with the organic phase. This step introduces a very high degree of porosity into the low-k composite film, enabling the k value to approach the "ideal" of "1".

According to an alternative embodiment, the same effect, i.e., a composite low-k film having high porosity with much or all of the dielectric matrix removed, is achieved by selectively etching away the matrix and leaving the cross-linked structure intact. For example, the low-k matrix may be etched by using fluorine chemistry, which is preferably selective towards the whisker or fiber reinforcing materials. Conventional etchants for low-k matrix materials are known to those of skill in the relevant arts and therefore further description here is deemed unnecessary.

Typically, low-k film manufacturers form porous films in order to reduce the k values to 2.0 or below. At chip technologies below 60 nm, the chemical vapor deposition (CVD) process is expected to encounter difficulties in forming consistency and uniformity of the pores across the wafer. By forming a volatile dielectric matrix film to combine with the whiskers, or one that can be etched away while leaving the cross-linked whisker structure, ultra low-k layers for chip technologies below 60 nm are expected to be formed and to overcome the problems encountered during conventional processing steps.

Preferably, the whiskers are randomly oriented to increase the structural strength of the low-k composite material. According to yet another alternative embodiment, the whiskers comprise a bipolar structure. During the formation process of the composite low-k layer, a field is applied to orient the whiskers in a preferred orientation. That is, the whiskers are configured anisotropically. This provides an advantage in aligning the whiskers to resist anticipated directional forces. For example, in a typical interconnect structure, the bipolar whiskers may be aligned to run perpendicular to metal lines to provide the highest mechanical stability.

According to another alternative embodiment, the whiskers are formed in situ. That is, in certain deposited films, the whiskers can be seeded, nucleated, and grown during the deposition process. For example, the deposition of a discontinuous seed film may be followed by the growth of the whiskers and the dielectric matrix, all of the above steps performed by CVD methods. According to this embodiment, the growth rate of the dielectric matrix is no greater than that of the whiskers, and thus the precursor gases and concentrations are selected accordingly.

By forming whiskers according to the embodiments disclosed, an advanced low-k dielectric composite film is provided that meets the needs for insulators in new generations of semiconductor devices. The low-k composite material, strengthened by reinforcement whiskers, improves overall chip performance by reducing interconnect capacitance while providing a mechanically sound layer meeting the needs of conventional process steps such as chemical mechanical planarization. These strengthened low-k layers in accordance with the embodiments of the present invention are expected to meet performance, density, and reliability requirements of future generations of devices.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a semiconductor integrated circuit dielectric composite firm, the method comprising:
    forming a dielectric matrix film on a semiconductor wafer; and
    distributing a reinforcing material comprising nanostructure whiskers throughout the dielectric matrix film to form the dielectric composite film wherein said nanostructure whiskers have a length dimension of less than about 100 nanometers.

2. The method of forming a semiconductor integrated circuit dielectric composite film as recited in claim 1 wherein the dielectric matrix film is selected from the group consisting of SiO$_2$ and low-k dielectric layers.

3. The method of forming a semiconductor integrated circuit dielectric composite film as recited in claim 1 when the reinforcing material is distributed simultaneously with the formation of the low-k dielectric matrix film using a CVD method.

4. The method of forming a semiconductor integrated circuit dielectric composite film as recited in claim 1 wherein the whiskers are rod-shaped and have a length in the range from 5 to 20 nm.

5. The method of forming a semiconductor integrated circuit dielectric composite film as recited in claim 1 wherein the whiskers have aspect ratios in the range of 5:1 to 300:1.

6. The method of forming a semiconductor integrated circuit dielectric composite film as recited in claim 1 wherein the whiskers are randomly oriented.

7. The method of forming a semiconductor integrated circuit dielectric composite film as recited in claim 1 wherein the volume of the whiskers in relation to the volume of the matrix material lies in the range from 0.1 to 10%.

8. The method of forming a semiconductor integrated circuit dielectric composite film as recited in claim 1 wherein the whiskers comprise one of SiC, Si$_3$N$_4$, and SiO$_2$, and diamond structured whiskers.

9. The method of forming a semiconductor integrated circuit dielectric composite film as recited in claim 1 wherein the reinforcement whiskers are formed in the composite layer by suspending the whiskers in a spin-on liquid.

10. The method of forming a semiconductor integrated circuit dielectric composite film as recited in claim 1 further comprising heating the dielectric matrix film to vaporize volatile components.

11. The method of forming a semiconductor integrated circuit dielectric composite film as recited in claim 1 further comprising etching dielectric matrix film to selectively remove a portion of the dielectric film matrix leaving a cross-linked structure comprising the reinforcing material.

12. The method of forming a semiconductor integrated circuit dielectric composite film as recited in claim 1 wherein the whiskers are single crystal nano-structures.

13. The method of form a semiconductor integrated circuit dielectric composite film as recited in claim 1 wherein the whiskers have a bipolar structure and further comprising applying a field to the dielectric composite film to orient the whiskers in a predetermined orientation.

14. The method as recited in claim 1 further comprising forming an inlaid conductive layer in the low-k composite layer.

15. The method as recited in claim 14 wherein the inlaid copper layer is a copper dual-damascene interconnect structure.

16. A dielectric composite film comprising:
    a low-k dielectric matrix film; and
    whisker reinforcements distributed throughout the film wherein the whisker reinforcements are selected from the group consisting of SiC, Si$_3$N$_4$, oxides, polymers, and diamond structured materials wherein the whiskers occupy a volume in the matrix in the range of 0.1 to 10%, wherein said whiskers have a length of less than 100 nm.

17. A dielectric composite film comprising:
    a low-k dielectric matrix film; and
    whisker reinforcements distributed throughout the film wherein the whisker reinforcements are selected from the group consisting of SiC, Si$_3$N$_4$, oxides, polymers, and diamond structured materials wherein the whiskers comprise rod shaped whiskers having a length of in the range of about 1 to about 50 nanometers and a cross-section of on the order of about 0.1 to about 5 nanometers.

18. A method of forming a semiconductor integrated circuit dielectric composite film, the method comprising:
    forming a dielectric matrix film on a semiconductor wafer; and
    distributing a reinforcing material comprising one of fibers and nanostructure whiskers throughout the dielectric matrix film to form the dielectric composite film wherein the reinforcing material is distributed simultaneously with the formation of the low-k dielectric matrix film using a CVD method.

19. A method of forming a semiconductor integrated circuit dielectric composite film, the method comprising:
    forming a dielectric matrix film on a semiconductor wafer,
    distributing a reinforcing material comprising one of fibers and nanostructure whiskers throughout the dielectric matrix film to form the dielectric composite film; and
    heating the dielectric matrix film to vaporize volatile components thereby increasing the porosity of the dielectric matrix film to lower the k value of the dielectric matrix film.

* * * * *